(12) United States Patent
Schlomann

(10) Patent No.: US 8,358,003 B2
(45) Date of Patent: Jan. 22, 2013

(54) SURFACE MOUNT ELECTRONIC DEVICE PACKAGING ASSEMBLY

(75) Inventor: Herbert W. Schlomann, Oradell, NJ (US)

(73) Assignee: Electro Ceramic Industries, Hackensack, NJ (US)

(*) Notice: Subject to any disclaimer, the term of this patent is extended or adjusted under 35 U.S.C. 154(b) by 226 days.

(21) Appl. No.: 12/791,545

(22) Filed: Jun. 1, 2010

(65) Prior Publication Data

US 2010/0309640 A1    Dec. 9, 2010

Related U.S. Application Data

(60) Provisional application No. 61/182,974, filed on Jun. 1, 2009.

(51) Int. Cl.
*H01L 23/12* (2006.01)
*H01L 23/48* (2006.01)

(52) U.S. Cl. ........ 257/704; 257/723; 257/784; 257/787; 257/E23.181

(58) Field of Classification Search .................. 257/723, 257/784, E23.024, 704
See application file for complete search history.

(56) References Cited

U.S. PATENT DOCUMENTS

| | | |
|---|---|---|
| 3,320,497 A | 5/1967 | Neuf |
| 3,676,292 A | 7/1972 | Pryor et al. |
| 3,726,987 A | 4/1973 | Pryor et al. |
| 3,767,979 A | 10/1973 | Reber et al. |
| 4,502,023 A | 2/1985 | Heitzmann |
| 4,566,027 A | 1/1986 | Heitzmann et al. |
| 4,604,677 A | 8/1986 | Suzuki et al. |
| 4,750,031 A | 6/1988 | Miller et al. |
| 4,781,612 A | 11/1988 | Thrush |
| 4,845,545 A | 7/1989 | Abramowitz et al. |
| 5,041,695 A | 8/1991 | Olenick et al. |
| 5,056,702 A | 10/1991 | Nakahashi et al. |
| 5,102,029 A | 4/1992 | Richardson et al. |
| 5,530,376 A | 6/1996 | Lim et al. |
| 5,569,958 A | 10/1996 | Bloom |
| 5,607,227 A * | 3/1997 | Yasumoto et al. ....... 362/249.06 |
| 5,621,615 A | 4/1997 | Dawson et al. |
| 5,750,926 A * | 5/1998 | Schulman et al. ........... 174/564 |
| 5,945,736 A | 8/1999 | Rife et al. |
| 5,994,975 A | 11/1999 | Allen et al. |
| 6,020,597 A | 2/2000 | Kwak |
| 6,072,322 A | 6/2000 | Viswanath et al. |
| 6,111,306 A * | 8/2000 | Kawahara et al. ........... 257/666 |
| 6,130,821 A | 10/2000 | Gerber |
| 6,426,511 B1 | 7/2002 | Nakagawa et al. |
| 6,506,632 B1 * | 1/2003 | Cheng et al. .................. 438/126 |
| 6,555,906 B2 * | 4/2003 | Towle et al. ................... 257/723 |
| 6,656,754 B1 | 12/2003 | Farnworth et al. |
| 6,723,379 B2 | 4/2004 | Stark |
| 6,784,020 B2 * | 8/2004 | Lee et al. ...................... 438/106 |
| 6,833,566 B2 | 12/2004 | Suehiro et al. |
| 6,849,942 B2 | 2/2005 | Lin et al. |
| 7,206,204 B2 | 4/2007 | Nakatsu et al. |
| 2004/0051173 A1 | 3/2004 | Koh et al. |
| 2004/0087043 A1 * | 5/2004 | Lee et al. .......................... 438/6 |

(Continued)

*Primary Examiner* — Nitin Parekh

(74) *Attorney, Agent, or Firm* — Howard IP Law Group, PC

(57) ABSTRACT

A surface mount electronic device packaging assembly includes a body having an aperture defined therethrough. The aperture is adapted to receive an electronic device therein. The body has a first surface and a second surface. An electrically conductive contact pad is disposed on the first surface of the body. The contact pad is adapted to receive a lead from the electronic device. A thermally conductive base pad is disposed on the second surface of the body. A top surface of the base pad is adapted to receive the electronic device thereon.

19 Claims, 5 Drawing Sheets

U.S. PATENT DOCUMENTS

| | | |
|---|---|---|
| 2004/0135247 A1 | 7/2004 | Takashima et al. |
| 2004/0177985 A1 | 9/2004 | Karavakis et al. |
| 2006/0267182 A1 | 11/2006 | Rumer et al. |
| 2007/0023879 A1 | 2/2007 | Pandy et al. |
| 2007/0096297 A1 | 5/2007 | Frey |
| 2009/0230487 A1* | 9/2009 | Saitoh et al. .................. 257/419 |

* cited by examiner

SURFACE MOUNT ELECTRONIC DEVICE PACKAGING ASSEMBLY

CROSS-REFERENCE TO RELATED APPLICATIONS

This application claims priority under 35 U.S.C. §119(e) to Provisional Patent Application Ser. No. 61/182,974 entitled "Surface Mount Electronic Device Packaging Assembly" filed Jun. 1, 2009, the subject matter thereof incorporated by reference in its entirety.

FIELD OF INVENTION

The present invention relates to electronic device packaging, and more particularly, to surface mount electronic device packaging assemblies.

BACKGROUND

Electronic components such as integrated circuit (IC) chips and diodes mounted on circuit boards are packaged to provide mechanical support and to protect and isolate the chips from the external environment. Depending on the application, these electronic components may generate high amounts of heat which must be dissipated in order to avoid damage to the components and/or the overall system, and to extend their operating life. Known heat dissipation techniques used in packaging electronic components result in added bulk and volume which undesirably increases the total size of the circuit boards and/or limits the number of components that can be placed within a given space. Alternative packaging techniques and assemblies are desirable.

SUMMARY OF THE INVENTION

According to an embodiment of the invention, a surface mount electronic device package assembly includes a body having at least one aperture defined therethrough. The body has a first surface and a second surface. At least one electrically conductive contact pad is disposed on the first surface of the body and at least one thermally conductive base pad is disposed on the second surface of the body. The at least one aperture is adapted to receive at least a portion of an electronic device and a top surface of the base pad is adapted to receive the electronic device thereon. The contact pad is configured to be in electrical contact with the electronic device.

In another embodiment of the present invention, a method of packaging an electronic device is provided. The method includes the steps of: (1) forming at least one aperture through a body; (2) forming a contact pad on a top surface of the body; (3) forming a base pad on a bottom surface of the body; and (4) mounting an electronic device on the base pad within the at least one aperture. The electronic device may be coupled to the contact pad.

BRIEF DESCRIPTION OF THE DRAWINGS

Understanding of the present invention will be facilitated by consideration of the following detailed description of the exemplary embodiments of the present invention taken in conjunction with the accompanying drawings, in which like numerals refer to like parts and in which.

DETAILED DESCRIPTION

Figure 1A:
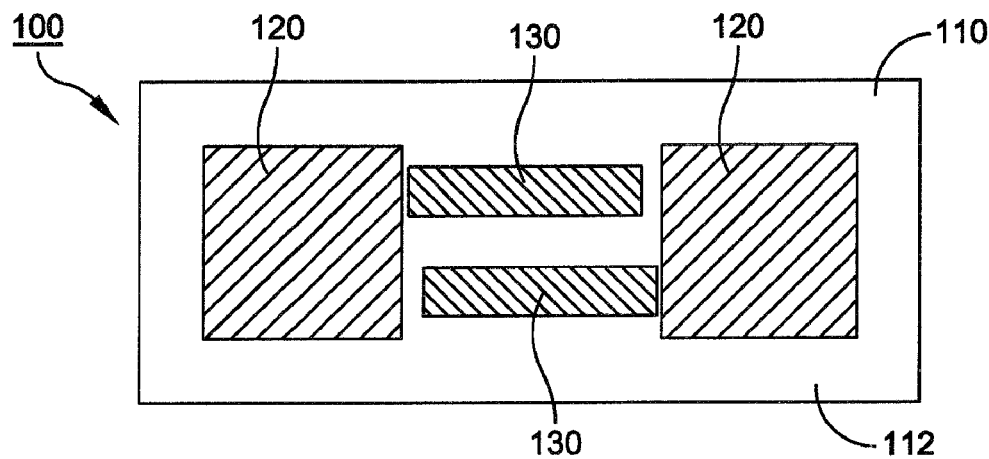
FIG. 1A is a top view of a surface mount electronic device package assembly according to an embodiment of the invention.

It is to be understood that the figures and descriptions of the present invention have been simplified to illustrate elements that are relevant for a clear understanding of the present invention, while eliminating, for purposes of clarity, many other elements found in typical electronic device packaging and surface mount packaging assemblies. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Figure 1B:
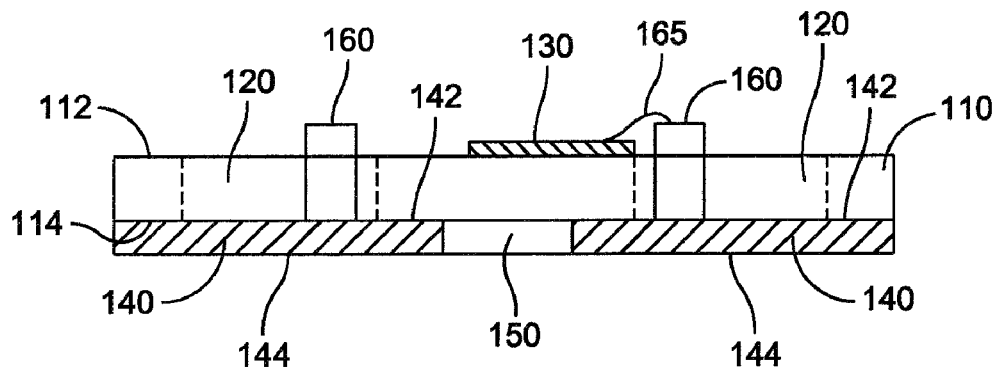
FIG. 1B is a cross-sectional side view of the surface mount assembly of FIG. 1A according to an embodiment of the invention.
Figure 1C:
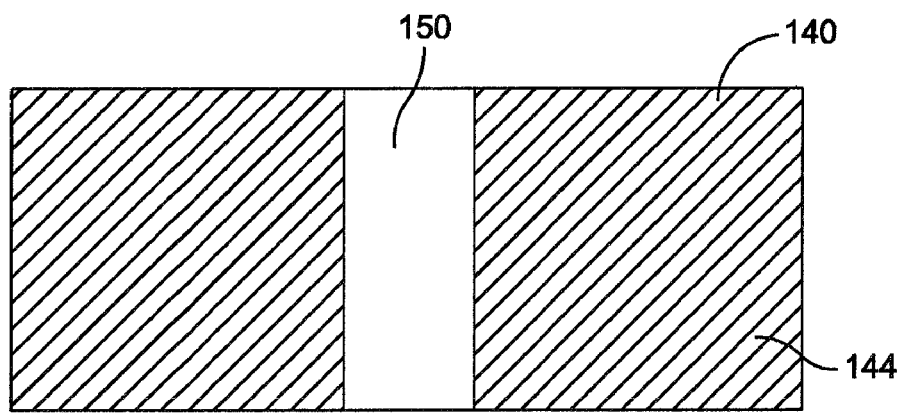
FIG. 1C is a bottom view of the surface mount assembly of FIG. 1A according to an embodiment of the invention.

Referring to FIGS. 1A-1C, a surface mount electronic device packaging assembly 100 according to an exemplary embodiment of the present invention is shown. Assembly 100 includes a body 110 having a first surface 112 and a second surface 114. In the illustrated embodiment, first surface 112 is defined as the top surface and second surface 114 is defined as the bottom surface opposite the top surface. In one configuration, body 110 may be fabricated from ceramic, for example low temperature co-fired ceramics or low-grade ceramics. It is understood, however, that the body 110 may be formed of other materials, including but not limited to alumina, beryllia, and polymeric materials, or a combination thereof.

An aperture or through hole 120 is defined in body 110 traversing from first surface 112 to second surface 114. In the illustrated embodiment, two apertures 120 are defined in body 110. It will be understood that any number of apertures 120 may be defined in body 110 depending on the requirements of a given application. In the illustrated embodiment, apertures 120 have a square shape, however, in other embodiments, apertures 120 may comprise any desired shape such as circular, polygonal, and oval, by way of non-limiting example, depending on the requirements of a given application.

Body 110 further includes a metalized contact pad 130 adjacent to apertures 120. In the illustrated embodiment, the body 110 includes two metalized contact pads 130, however, it is envisioned that any number of contact pads 130 may be utilized depending on the desired application, without departing from the scope of the present invention. Metalized contact pads 130 may take the form of elongated pads plated with nickel. In other configurations, contact pads 130 may also take form of metalized silver pads, or glass frits. In further embodiments, metalized contact pads 130 may be plated with gold, silver, copper or other electrically conductive material which is also conducive to wire bonding. Contact pads 130 may be disposed on a metalized area of first surface 112 of body 110. The metalized area may be formed from, for example, molybdenum and manganese (molymanganese).

In one configuration, contact pads 130 may have non-magnetic characteristics. Such non-magnetic characteristics of contact pad 130 may render assembly 100 suitable for use in applications wherein assembly 100 may be subjected to external magnetic fields, such as Magnetic Resonance Imaging (MRI) devices. As is known in the art, the presence of any magnetizable materials may adversely affect the performance of the MRI devices. In another configuration, contact pads 130, such as nickel pads, may have magnetic characteristics. Such contact pads with magnetic characteristics may be utilized in applications, for example, wherein the presence of magnetizable materials is not a concern.

As shown in FIG. 1B, assembly 100 further includes two base pads 140 each having a top surface 142 and a bottom surface 144. Base pads 140 are disposed on second surface 114 of body 110 such that top surface 142 of base pads 140 are affixed to second surface 114 of body 110. Base pads 140 are further adapted to be mounted on a substrate, for example, a circuit board (not shown), along their bottom surface 144. Mounting of the based pads 140 to a circuit board may be accomplished by soldering or brazing, for example.

Preferably, base pads 140 are formed from a good thermal conductor such as copper, by way of example only. In another configuration, base pads 140 may be nickel-cobalt ferrous alloy pads, such as those sold under trademark KOVAR® from Carpenter Technology Corporation, or other thermal conductors. While two base pads 140 are shown, it is envisioned that assembly 100 may comprise any number of base pads 140 depending on a desired application or performance characteristics.

In an embodiment of the present invention, at least one of base pads 140 is adapted to contactingly receive and engage an electronic device 160, such as an IC chip, on top surface 142, when at least a portion of electronic device 160 is placed into aperture 120 from first surface 112 of assembly 100. In the illustrated embodiment, the arrangement 100 comprises two electronic devices 160 each arranged in a corresponding one of apertures 120. Electronic devices 160 may be affixed to the base pad 140 via well known means, such as soldering, ultrasonic scrubbing or bonding. Further, electronic devices 160 may be electrically coupled to contact pads 130 through any suitable means, for example, a lead 165 arranged therebetween.

Electronic devices 160 are coupled with base pads 140 so as to effectively conduct heat generated by the electronic devices 160 to base pads 140. Base pads 140 may then dissipate the heat to the substrate on which base pads 140 are mounted, for example, a circuit board. Base pads 140 may be separated from one another via an isolation zone 150. Isolation zone 150 provides isolation, including electrical and thermal isolation, between the two electronic devices 160. Isolation zone 150 may comprise an air gap or may be filled with a layer of isolation material, including an extension or projection of body 110 between base pads 140.

According to the particular application, as described above, packaging assembly 100 may be configured so as to be non-magnetizable. That is, assembly 100 is to be formed entirely of constituent materials that are not magnetized in the presence of an external magnetic field (e.g., non-ferrous materials). Such constituent materials include, but are not limited to copper, gold, and silver. It is understood that non-ferrous materials such as nickel are magnetizable and thus cannot be utilized in particular applications. It is further understood that for applications where the presence of magnetizable materials is not a concern, such ferrous and/or magnetizable constituent materials may be utilized.

By way of example only, assembly 100 may have the following dimensions. Body 110 may have a length of about 0.24 inch, a width of about 0.1 inch and a height of about 0.02 inch. Apertures 120 may a width of about 0.06 inch and a length of about 0.06 inch. Base pads 140 may have a thickness of about 0.01 inch. It will of course be understood that any and all of these dimensions may be varied according to the requirements of various applications.

Figure 2A:
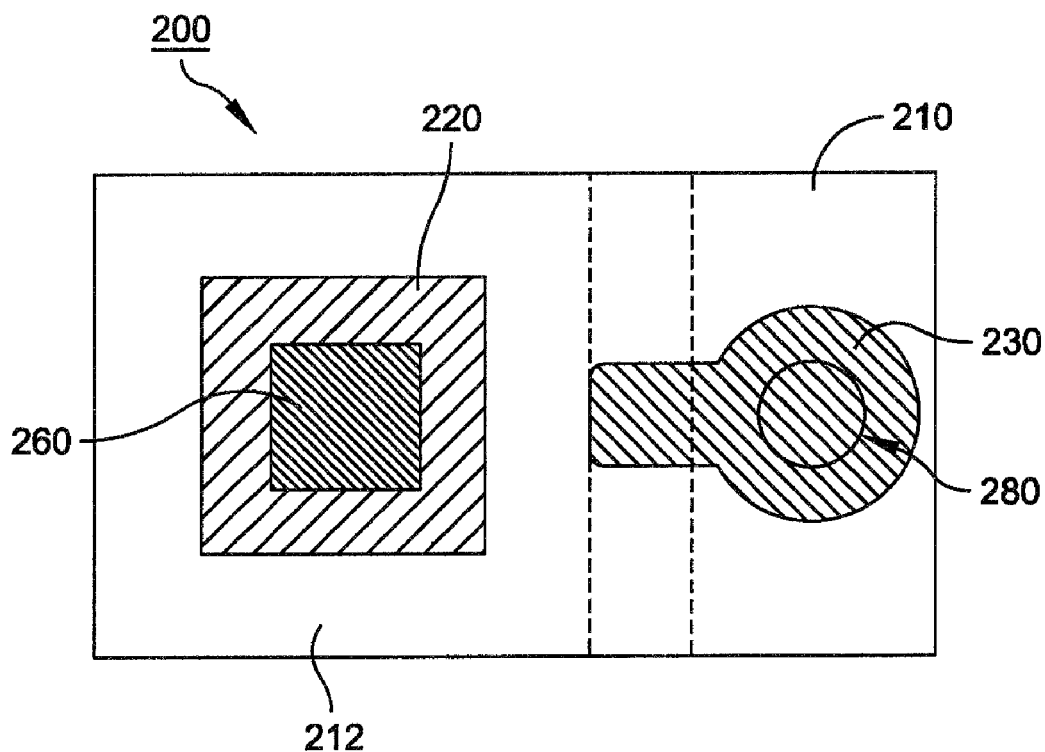
FIG. 2A is a top view of a surface mount electronic device package assembly according to another embodiment of the invention.
Figure 2B:
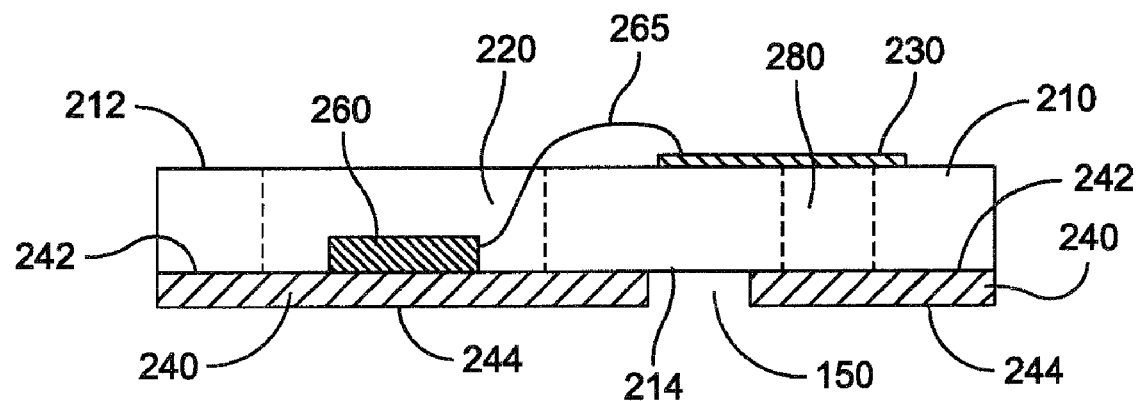
FIG. 2B is a cross-sectional side view of the surface mount assembly of FIG. 2A according to an embodiment of the invention.

Referring now to FIGS. 2A-2B, a surface mount electronic device packaging assembly 200 according to another embodiment of the invention is shown. Assembly 200 includes a body 210 having a first surface 212 and a second surface 214. In an exemplary embodiment, body 210 may be a ceramic body. Aperture 220 is defined in body 210 traversing from first surface 212 to second surface 214. In the illustrated embodiment, only one aperture 220 is defined in body 210. Base pads 240 having a top surface 242 and a bottom surface 244 are disposed on second surface 214 of body 210 and may be separated by an isolation gap 250 as described above with respect to FIGS. 1B and 1C.

Assembly 200 further includes an electronic device 260 disposed on top surface 242 of base pad 140 within aperture 220. In one configuration, electronic device 260 may take the form of an integrated circuit chip. In another configuration, electronic device 260 may take the form of a microwave diode. In the illustrated embodiment, electronic device 260 is completely disposed within aperture 220. An electrically conductive metalized contact pad 230 is disposed on first surface 212 of body 210. Contact pad 230 may be adapted to receive a lead 265 from electronic device 260, lead 265 providing electrical communication between the contact pad 230 and the electronic device 260.

A through-hole 280 is defined within body 210 beneath contact pad 230. In an exemplary embodiment, through-hole 280 may be in physical contact with base pad 240 and/or contact pad 230. Preferably, through-hole 280 is metalized, thereby forming a conductive via between contact pad 230 and base pad 240. Accordingly, in one embodiment of the present invention, electronic device 260 may be electrically coupled to contact pad 230, which is further coupled to metalized through-hole 280. Thus, electronic device 260 may be coupled or grounded to base pad 240 through contact pad 230 and through-hole/via 280.

With respect to the embodiment shown in FIGS. 2A and 2B, it should be noted that like components, such as the contact and base pads 230, 240, body 210, aperture 220, and through-hole 280 may be formed from like materials and in like configurations as those described above with respect to FIGS. 1A-1C. Further, because assembly 200 is adapted to house only one electronic device 260, it may be made smaller than assembly 100, resulting in a more compact packaging. For example, in the illustrated embodiment, the length of body 210 is smaller than that of body 110 of assembly 100 (see FIG. 1A).

Referring now to FIGS. 3A-3D, a surface mount electronic device packaging assembly 300 is illustrated according to yet another embodiment of the present invention. Assembly 300 includes a body 310 having a first surface 312 and a second surface 314. In an exemplary embodiment, body 310 may be a ceramic body similar to that described above with respect to FIGS. 1A-1C. Apertures 320 are defined in body 310 traversing from first surface 312 to second surface 314. Base pads 340 having top surfaces 342 and bottom surfaces 344 are disposed on second surface 314 of body 310 such that top surfaces 342 face second surface 314 of body 310. Assembly 300 further includes an electronic device 360 disposed on top surface 342 of one base pad 340 within aperture 320. In one configuration, electronic device 360 may take the form of an integrated circuit chip. In another configuration, electronic device 360 may take the form of a microwave diode. An electrically conductive metalized contact pad 330 is disposed on first surface 312 of body 310. Contact pad 330 is adapted to be in electrical communication with electronic device 360 via, for example, a lead 365. In the illustrated embodiment, contact pad 330 is adapted to receive a lead 365 from electronic device 360 disposed within aperture 320 on one side of contact pad 330. As described above with respect to FIGS. 2A-2B, contact pad 330 may be grounded to base pad 340 via the remaining aperture 320. In another configuration (not shown), a second electronic device 360 may be disposed in remaining aperture 320, such that each of apertures 320 receive an electronic device 360. Each of two electronic devices 360 may be electrically coupled to contact pad 330.

Figure 3A:
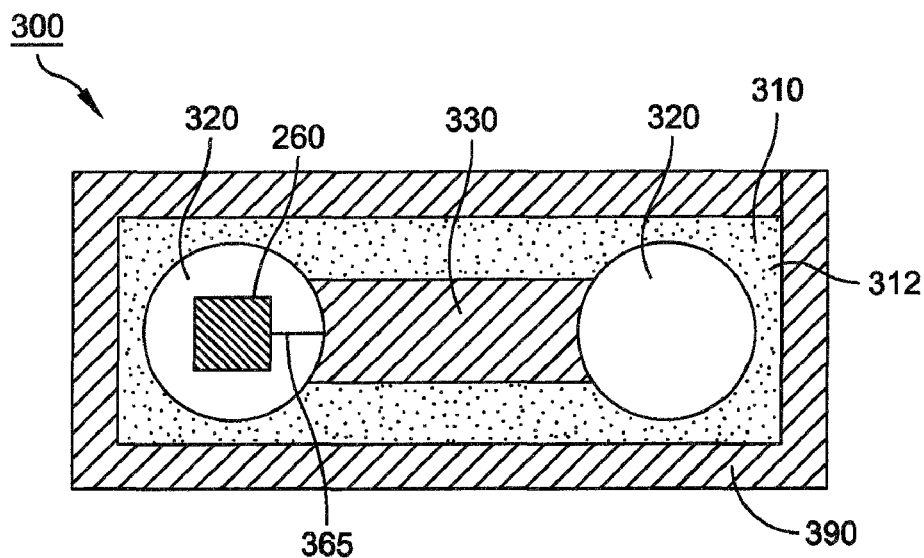
FIG. 3A is a top view of a hermetic surface mount electronic device package assembly according to an embodiment of the invention.
Figure 3B:
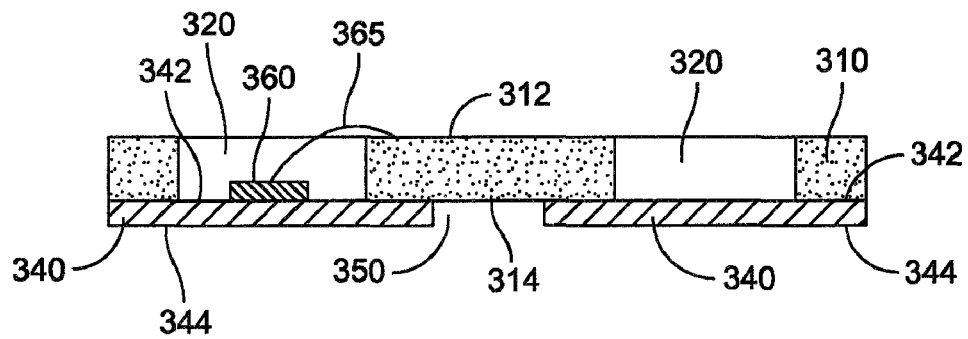
FIG. 3B is a cross-sectional side view of the hermetic surface mount assembly of FIG. 3A according to an embodiment of the invention.
Figure 3C:
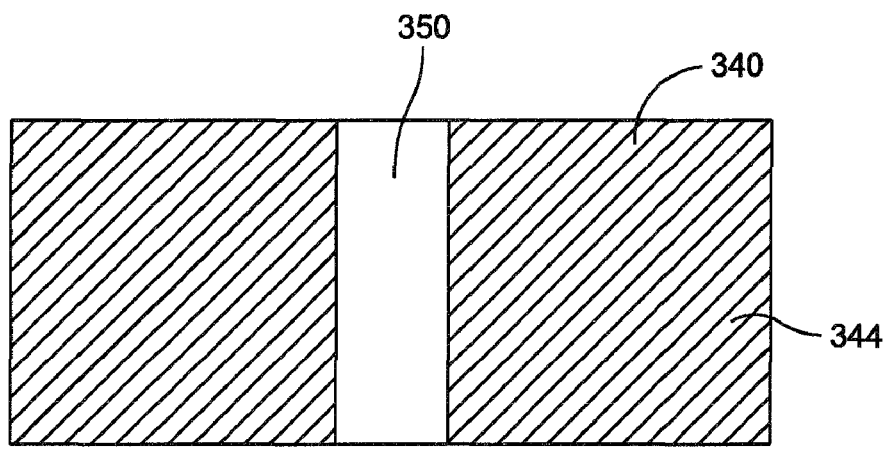
FIG. 3C is a bottom view of the hermetic surface mount assembly of FIG. 3A according to an embodiment of the invention.
Figure 3D:
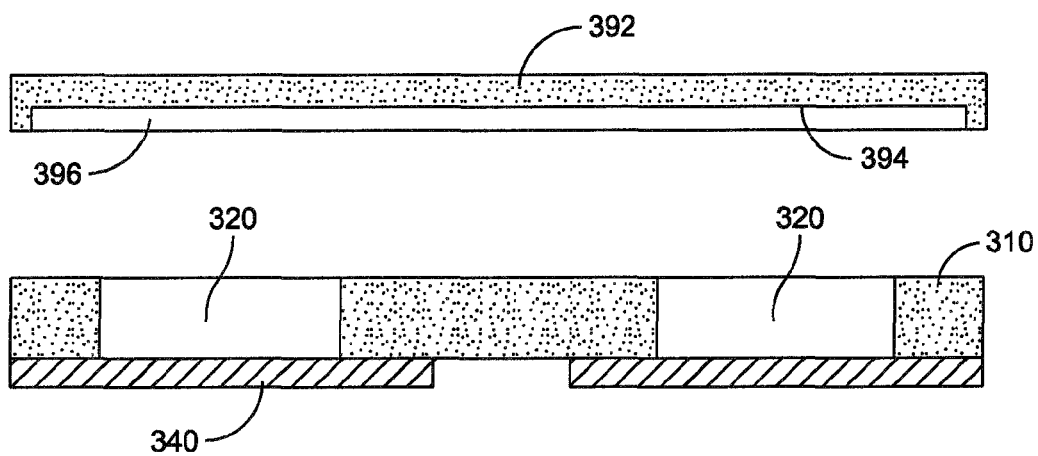
FIG. 3D is a cross-sectional side view of the hermetic surface mount assembly of FIG. 3A with a cover according to an embodiment of the invention.
Figure 4:
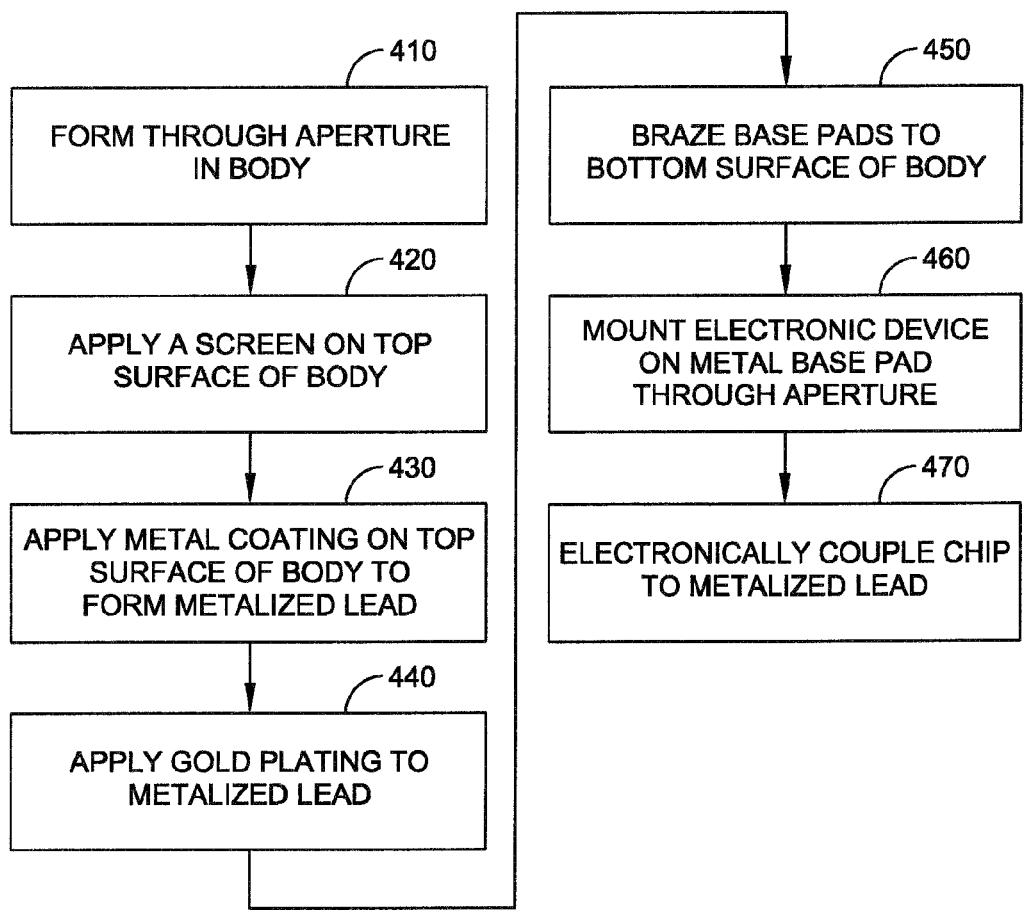
FIG. 4 is a process flow diagram for fabricating the surface mount assembly of FIG. 1A according to an embodiment of the invention.

Referring to FIGS. 3A and 3D, a metalized window frame 390 may be disposed along the perimeter of body 310 on first surface 312 thereof. In one configuration, frame 390 may be formed in the same manner as the formation of metalized contact pad 330. By way of non-limiting example only, frame 390 may be formed using tungsten and/or molymanganese on body 310. A cover 392 may be affixed to frame 390 using known techniques such as soldering or bonding using, for example, an epoxy. In one configuration, frame 390 serves to receive cover 392. In other configurations, body 310 may receive cover 392 without frame 390, for example, by using epoxy to affix cover 392 to body 310. In one configuration, cover 392 may comprise a ceramic cover. In another configuration, cover 392 may be a metallic cover. In the illustrated configuration, cover 392 includes a rim 394. Rim 394 encloses a space 396. In one embodiment, cover 392, when disposed on body 310, hermetically seals assembly 300. Space 396 provides room for lead 365 connecting electronic device 360 to contact pad 330. Such a hermetically sealed assembly 300 isolates and protects electronic device 360 disposed within aperture 320 from the external environment.

Referring now to FIG. 4 and FIGS. 1A-1C, a process for fabricating assembly 100, for example, is described. At step 410, apertures 120 are formed in body 110. Such formation may be accomplished via lasers or other machining/micromachining and/or chemical etching techniques used to form apertures. At step 420, a screen, for example, a stenciled screen, is positioned on first surface 112 of body 110. At step 430, a metal coating is applied on first surface 112 via the screen to form metalized contact pad 130. In an exemplary process, the metal coating may be applied by heating body 110 and the metal coating at temperatures of about 1415° Celsius for about 30 minutes to 45 minutes. By way of non-limiting example only, body 110 may be metalized using molybdenum and manganese in a wetted atmosphere of hydrogen. In another configuration, (e.g., for applying a silver lead) the process may be accomplished without a hydrogen atmosphere (e.g. air atmosphere). It will be understood that the temperatures and the duration of heating may be adjusted according to the requirements of a given application.

Metalized contact pad 130 is plated with, for example, gold, at step 440. At step 450, base pad 140 is, for example, brazed to second surface 114 of body 110. In one configuration, a high temperature brazing may be utilized to braze top surface 142 of a copper pad 140 to second surface 114 of body 110. At step 460, an electronic device 160, such as an integrated circuit chip, is mounted on top surface 142 of base pad 140 within aperture 120. Electronic device 160 is coupled to metalized contact pad 130 via lead 165 at step 470.

It will be understood that appropriate changes may be made to the described process to fabricate assemblies 200 (FIG. 2A), 300 (FIG. 3A) and any variations of these assemblies described or inferred herein.

In known packaging assemblies, electronic device 160 is generally mounted on materials such as ceramic and a separate heat sink arrangement is required to dissipate heat generated by electronic device 160. Such separate heat sink arrangements result in bulkier packaging assemblies. An advantage of the disclosed embodiments is that base pad 140, being a good thermal conductor, acts as a heat sink to electronic device 160, which obviates the need for a separate heat sink arrangement. Thus, the disclosed embodiments result in a compact packaging assembly for electronic device. An advantage of compact packaging assembly is that a higher number of such assemblies may be accommodated within a given space. For example, in an MRI device, a higher number of electronic devices may be accommodated on a smaller substrate such as a circuit board. Such high density of electronic device packaging may provide a higher resolution for MRI images, a more compact MRI device and/or a more powerful MRI device. Another advantage of compact packaging is that a given number of electronic devices may be accommodated on a smaller substrate, resulting in a more compact design of a substrate.

The surface mount electronic device packaging assembly as disclosed herein and containing a microwave diode, for example, may be used for, but not limited to, radio frequency limiting and switching, voltage variable tuning, radio frequency conversion to DC voltage and current, and small frequency mixing.

While the foregoing invention has been described with reference to the above-described embodiment, various modifications and changes can be made without departing from the spirit of the invention. Thus, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An electronic device packaging assembly comprising:
a body having a first surface and a second surface, the body having at least one aperture defined therethrough;
at least one electrically conductive contact pad disposed on the first surface of the body;
at least one base pad disposed on the second surface of the body,
wherein the at least one aperture is adapted to receive at least a portion of an electronic device, the electronic device in at least thermal conductive contact with the at least one base pad, and wherein the assembly further comprises a frame disposed around a perimeter of the body, wherein the frame is configured to receive a cover, the frame and the cover arranged to hermetically seal the at least one aperture and electronic device from an external environment.

2. The assembly of claim 1, wherein the at least one aperture comprises a first and a second aperture.

3. The assembly of claim 2, wherein the first aperture is adapted to receive at least a portion of a first electronic device, and the second aperture is adapted to receive at least a portion of a second electronic device.

4. The assembly of claim 3, wherein the at least one contact pad comprises a first and second contact pad.

5. The assembly of claim 4, wherein the first and second contact pads are in conductive contact with the first and second electronic devices.

6. The assembly of claim 2, wherein the first aperture is adapted to receive at least a portion of an electronic device, and the second aperture is arranged in contact with the at least one contact pad.

7. The assembly of claim 6, wherein the second aperture is metalized and in electrically conductive contact with the at least one contact pad.

8. The assembly of claim 2, wherein the at least one base pad comprises a first and second base pad.

9. The assembly of claim 8, wherein the first and second base pads are separated by an insulating portion.

10. The assembly of claim 1, wherein said contact pad is adapted to receive a lead from the electronic device.

11. The assembly of claim 1, wherein the electronic device is completely disposed within the at least one aperture.

12. The assembly of claim 1, wherein the at least one base pad is further disposed on a circuit board.

13. The assembly of claim 1, wherein the body comprises a ceramic material.

14. The assembly of claim 1, wherein the electric device is disposed on a top surface of the base pad within the at least one aperture in the body.

15. The assembly of claim 1, wherein the at least one base pad comprises at least one metal base pad.

16. The assembly of claim 1, wherein the frame comprises a metalized layer deposited around the perimeter of the body.

17. The assembly of claim 16, wherein the cover is affixed to the frame via soldering.

18. The assembly of claim 1, wherein the cover further comprises a rim formed around the perimeter of the cover, wherein the rim is configured to mate with the frame.

19. The assembly of claim 18, wherein the rim defines a hollow space within the cover.

* * * * *